(12) United States Patent
Ikezaki (10) Patent No.: US 8,155,404 B2
(45) Date of Patent: Apr. 10, 2012

(54) IMAGE DISPLAY APPARATUS, IMAGE DISPLAY METHOD AND MAGNETIC RESONANCE IMAGING APPARATUS

(75) Inventor: Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 1339 days.

(21) Appl. No.: 12/015,292

(22) Filed: Jan. 16, 2008

(65) Prior Publication Data

US 2012/0062225 A1    Mar. 15, 2012

(30) Foreign Application Priority Data

Jan. 17, 2007   (JP) ................. 2007-008451

(51) Int. Cl.
*G06K 9/00*    (2006.01)

(52) U.S. Cl. ........ 382/128; 382/130; 382/131; 382/132; 382/151; 382/154; 382/294; 382/309; 348/222.1; 378/21; 128/922

(58) Field of Classification Search ............... 382/128, 382/130, 131, 132, 151, 154, 294, 309; 378/21; 128/922; 348/222.1
See application file for complete search history.

(56) References Cited

U.S. PATENT DOCUMENTS

| 5,684,400 | A | 11/1997 | Tsukamoto et al. |
| 6,163,152 | A | 12/2000 | Bernstein et al. |
| 6,670,812 | B1 | 12/2003 | Mock et al. |
| 6,975,113 | B1 | 12/2005 | Gurr |
| 2007/0088209 | A1* | 4/2007 | Lotjonen ................. 600/407 |
| 2008/0080755 | A1* | 4/2008 | Payonk et al. ............... 382/128 |

FOREIGN PATENT DOCUMENTS

JP    2000-060821    2/2000

* cited by examiner

*Primary Examiner* — Robert Kim
*Assistant Examiner* — Nicole Ippolito
(74) *Attorney, Agent, or Firm* — Armstrong Teasdale LLP (57) ABSTRACT

An image display apparatus which displays a form image indicative of a form about an imaging area of a subject and a quantitative value image indicative of quantitative values measured with respect to characteristics of the imaging area, said image display apparatus includes a display unit which displays the form image on a display screen thereof and a specific area setting unit which sets a specific area at the form image displayed on the display screen by the display unit. When the specific area is set at the form image by the specific area setting unit, the display unit displays the quantitative value image on the display screen side by side with the form image in such a manner that the quantitative value image indicates the quantitative values measured with respect to a position corresponding to the specific area set at the imaging area.

20 Claims, 7 Drawing Sheets

IMAGE DISPLAY APPARATUS, IMAGE DISPLAY METHOD AND MAGNETIC RESONANCE IMAGING APPARATUS

CROSS REFERENCE TO RELATED APPLICATIONS

This application claims the benefit of Japanese Patent Application No. 2007-008451 filed Jan. 17, 2007.

BACKGROUND OF THE INVENTION

The present invention relates to an image display apparatus, an image display method and a magnetic resonance imaging apparatus. The present invention relates particularly to an image display apparatus, an image display method and a magnetic resonance imaging apparatus, each of which displays a form image indicative of a form about an imaging area of a subject, and a quantitative value image indicative of quantitative values measured with respect to characteristics of the imaging area.

An image display apparatus for a magnetic resonance imaging (MRI) apparatus or the like displays an image of a subject and has frequently be used for medical applications, in particular.

In the magnetic resonance imaging apparatus, an imaging area of a subject is accommodated in an imaging space formed with a static magnetic field thereby to arrange spins of proton in the imaging area in the direction in which the static magnetic field is formed, and a magnetization vector thereof is produced. An RF pulse having a resonant frequency is applied to generate a nuclear magnetic resonance (NMR) phenomenon, thereby flipping the spins and changing the magnetization vector of the proton. Thereafter, the magnetic resonance imaging apparatus receives magnetic resonance (MR) signals produced when the proton is returned to the original state of magnetization vector. Based on the received magnetic resonance signals, a form image indicative of the form of the imaging area, a quantitative image indicative of the characteristics of the imaging area, etc. are produced and displayed.

Described specifically, each of slice images indicative of tissues such as organs is displayed as a form image with respect to a slice plane of the subject. As to an MRA image indicative of the velocity of flow of blood or the like flowing into the blood vessels of the subject, a phase image obtained by a phase contrast method, an ADC (Apparent Diffusion Coefficient) map formed as a diffusion image or the like is displayed as a quantitative image indicative of quantitative values obtained by measuring characteristics in the subject (refer to, for example, a patent document 1).

Patent Document 1. Japanese Unexamined Patent Publication No. 2000-60821.

After a specific area like, for example, a region of interest is set at the quantitative image by an operator, quantitative values measured with respect to the specific area are produced as a quantitative value image expressed in figures from pixel values about the set specific area. Then, the quantitative value image is displayed on a display screen side by side with the quantitative image such as the ADC map. Thus, a quantitative image diagnosis can be effected on the specific area.

Since, however, form information indicative of the position of a form of each tissue such as an organ may not be displayed sufficiently with respect to the quantitative image such as the ADC map, there is a case in which checking a tissue targeted for diagnosis and a quantitative value about the tissue against each other is difficult. That is, since there is a case in which it is difficult to accurately grasp the position of the tissue targeted for diagnosis at the quantitative image, there is a case where accurately grasping the quantitative value of the characteristic of the tissue is difficult.

Therefore, the operation of switching the display to the quantitative image again after the form image indicative of the form of each tissue is displayed to grasp and the position of the tissue, and specifying the tissue's position at the quantitative image is executed. Thus, it was necessary to perform a cumbersome operation.

When the centers of FOVs (Fields Of View) of the form image and the quantitative image are placed in their corresponding positions different from each other, it was difficult to compare the positions of the tissues of the two to each other and specify the same even when the above operation was carried out.

Thus, since it is not easy to accurately specify the position of each tissue targeted for diagnosis upon quantitatively diagnosing the target for diagnosis, there was a case in which improving diagnostic efficiency was difficult.

SUMMARY OF THE INVENTION

Thus, the invention is to provide an image display apparatus, an image display method and a magnetic resonance imaging apparatus each of which is easy to accurately specify the position of each tissue targeted for diagnosis upon quantitatively diagnosing the target for diagnosis and is capable of improving diagnostic efficiency.

There is provided an image display apparatus of the invention, which displays a form image indicative of a form about an imaging area of a subject and a quantitative value image indicative of quantitative values measured with respect to characteristics of the imaging area, the image display apparatus comprising a display unit which displays the form image on a display screen thereof, and a specific area setting unit which sets a specific area at the form image displayed on the display screen by the display unit, wherein when the specific area is set at the form image by the specific area setting unit, the display unit displays the quantitative value image on the display screen side by side with the form image in such a manner that the quantitative value image indicates the quantitative values measured with respect to a position corresponding to the specific area set at the imaging area.

Preferably, the display unit displays the quantitative value image in such a manner that the quantitative values are expressed in figures.

Preferably, the display unit displays the quantitative value image in such a manner that the quantitative value image indicates the average of the quantitative values measured at the position corresponding to the specific area.

Preferably, the image display apparatus further includes an operation unit to which the position of the specific area set at the form image is inputted by an operator, and the specific area setting unit sets the specific area at the form image so as to correspond to the position of the specific area inputted to the operation unit.

Preferably, the form image is a slice image image-reconstructed based on each of magnetic resonance signals obtained from the imaging area of the subject.

Preferably, the quantitative values are measured based on the magnetic resonance signals obtained from the subject.

There is provided an image display method of the invention for displaying a form image indicative of a form about an imaging area of a subject, and a quantitative value image indicative of quantitative values measured with respect to characteristics of the imaging area, the image display method comprising the following steps: a display step for displaying the form image on a display screen, and a specific area setting step for setting a specific area at the form image displayed on the display screen in the display step, wherein when the specific area is set at the form image in the specific area setting step, the quantitative value image is displayed on the display screen side by side with the form image so as to indicate the quantitative values measured with respect to a position corresponding to the specific area set at the imaging area.

Preferably, the quantitative value image is displayed in such a manner that the quantitative values are expressed in figures.

Preferably, the quantitative value image is displayed so as to indicate the average of the quantitative values measured at the position corresponding to the specific area.

Preferably, the image display method further includes an operation step for allowing an operator to input the position of the specific area at the form image, and in the specific region setting step, the specific area is set at the form image so as to correspond to the position of the specific area inputted in the operation step.

Preferably, the form image is a slice image image-reconstructed based on each of magnetic resonance signals obtained from the imaging area of the subject.

Preferably, the quantitative values are measured based on the magnetic resonance signals obtained from the subject.

There is provided a magnetic resonance imaging apparatus of the invention which acquires magnetic resonance signals from an imaging area of a subject in an imaging space formed with a static magnetic field and which generates a form image indicative of a form about the imaging area and a quantitative value image indicative of quantitative values measured with respect to characteristics of the imaging area, based on the acquired magnetic resonance signals and displays the two, the magnetic resonance imaging apparatus comprising an image generation unit which generates the form image, based on the magnetic resonance signals, a display unit which displays the form image generated by the image generation unit on a display screen thereof, and a specific area setting unit which sets a specific area at the form image displayed on the display screen by the display unit, wherein the display unit displays the quantitative value image generated by the image generation unit side by side with the form image on the display screen.

Preferably, the image generation unit generates the quantitative value image in such a manner that the quantitative values are expressed in figures.

Preferably, the image generation unit generates the quantitative value image in such a manner that the quantitative value image indicates the average of the quantitative values measured at a position corresponding to the specific area.

Preferably, the magnetic resonance imaging apparatus further includes an operation unit to which the position of the specific area set at the form image is inputted by an operator, and the specific area setting unit sets the specific area at the form image so as to correspond to the position of the specific area inputted to the operation unit.

Effects of the Invention. According to the invention, there can be provided an image display apparatus, an image display method and a magnetic resonance imaging apparatus each of which is easy to accurately specify the position of each tissue targeted for diagnosis upon quantitatively diagnosing the target for diagnosis and is capable of improving diagnostic efficiency.

Further objects and advantages of the present invention will be apparent from the following description of the preferred embodiments of the invention as illustrated in the accompanying drawings.

DETAILED DESCRIPTION OF THE INVENTION

One example of an embodiment according to the invention will be explained below with reference to the accompanying drawings.

Figure 1:
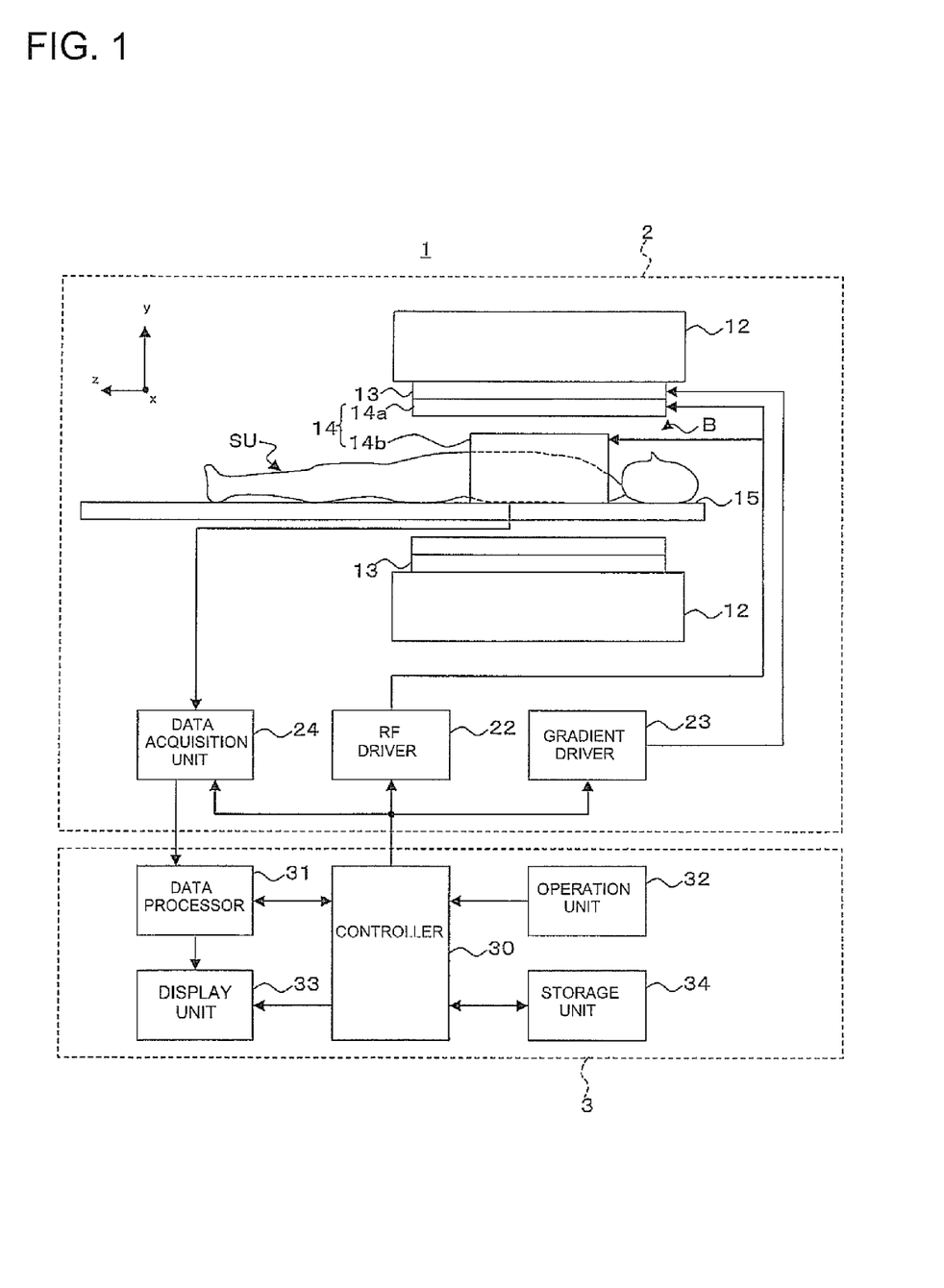
FIG. 1 is a configurational diagram showing a construction of a magnetic resonance imaging apparatus 1 illustrative of an embodiment according to the invention.

Apparatus construction. FIG. 1 is a configurational diagram showing a construction of a magnetic resonance imaging apparatus 1 illustrative of the embodiment according to the invention.

As shown in FIG. 1, the magnetic resonance imaging apparatus 1 of the present embodiment has a scan section 2 and an operation console section 3. Magnetic resonance signals are acquired or collected from an imaging area of a subject in an imaging space B formed with a static magnetic field. A form image indicative of a form about the imaging area, and a quantitative value image indicative of quantitative values measured with respect to the characteristics of the imaging area are produced based on the acquired magnetic resonance signals and displayed.

The scan section 2 will be described.

As shown in FIG. 1, the scan section 2 has a static magnetic field magnet unit 12, a gradient coil unit 13, an RF coil unit or part 14, a cradle 15, an RF driver 22, a gradient driver 23 and a data acquisition unit 24.

Respective constituent elements of the scan section 2 will be explained sequentially.

The static magnetic field magnet unit 12 comprises, for example, a superconductive magnet (not shown) and forms a static magnetic field in the imaging space B in which the subject SU is accommodated or held. Here, the static magnetic field magnet unit 12 forms the static magnetic field so as to extend along a body-axis direction (z direction) of the subject SU placed on the cradle 15. Incidentally, the static magnetic field magnet unit 12 may be constituted of a pair of permanent magnets.

The gradient coil unit 13 forms a gradient magnetic field in the imaging space B formed with the static magnetic field and applies or adds spatial position information to each magnetic resonance signal received by the RF coil unit 14. Here, the gradient coil unit 13 comprises three systems set so as to correspond to three-axis directions of a z direction extending along a static magnetic field direction and an x direction and a y direction orthogonal to one another. These transmit gradient pulses in a frequency encode direction, a phase encode direction and a slice selection direction according to imaging conditions respectively so as to form gradient magnetic fields. Described specifically, the gradient coil unit 13 applies the gradient magnetic field in the slice selection direction of the subject SU and selects a slice of the subject SU excited by transmission of an RF pulse by the RF coil unit 14. The gradient coil unit 13 applies the gradient magnetic field in the phase encode direction of the subject SU and phase-encodes a magnetic resonance signal from the slice excited by the RF pulse. And the gradient coil unit 13 applies the gradient magnetic field in the frequency encode direction of the subject SU and frequency-encodes the magnetic resonance signal from the slice excited by the RF pulse.

The RF coil unit 14 transmits an RF pulse corresponding to an electromagnetic wave to the subject SU within the imaging space B formed with the static magnetic field by the static magnetic field magnet unit 12 to form a high frequency magnetic field, thereby exciting the spins of proton in the subject SU. The RF coil unit 14 receives an electromagnetic wave generated from the excited proton in the subject SU as a magnetic resonance signal. In the present embodiment, the RF coil unit 14 has a first RF coil 14*a* and a second RF coil 14*b* as shown in FIG. 1. Here, the first RF coil 14*a* is of, for example, a bird cage type body coil and is disposed so as to surround the imaging area of the subject SU. On the other hand, the second RF coil 14*b* is of a coil ununiform in reception sensitivity distribution as compared with the first RF coil 14*a* in the imaging area and is also a phased-array coil in which a plurality of surface coils are disposed along the surface of the imaging area of the subject SU.

The cradle 15 has a table that places the subject SU thereon. The cradle 15 moves the table between the inside and outside of the imaging space B, based on a control signal supplied from a controller 30.

The RF driver 22 drives the RF coil unit 14 to transmit an RF pulse to within the imaging space B, thereby forming a high frequency magnetic field in the imaging space B. The RF driver 22 modulates a signal sent from an RF oscillator (not shown) to a signal having predetermined timing and predetermined envelope using a gate modulator (not shown) on the basis of the control signal outputted from the controller 30. Thereafter, the RF driver 22 allows an RF power amplifier (not shown) to amplify the signal modulated by the gate modulator and outputs the same to the RF coil unit 14, and allows the RF coil unit 14 to transmit the corresponding RF pulse.

The gradient driver 23 applies a gradient pulse to the gradient coil unit 13 based on the control signal outputted from the controller 30 to drive the gradient coil unit 13, thereby to generate a gradient magnetic field within the imaging space B formed with the static magnetic field. The gradient driver 23 has a three-system drive circuit (not shown) in association with the three-system gradient coil unit 13.

The data acquisition unit 24 acquires each magnetic resonance signal received by the RF coil unit 14 based on the control signal outputted from the controller 30. Here, the data acquisition unit 24 phase-detects the magnetic resonance signal received by the RF coil unit 14 using a phase detector (not shown) with the output of the RF oscillator (not shown) of the RF driver 22 as a reference signal. Thereafter, the data acquisition unit 24 converts the magnetic resonance signal corresponding to the analog signal into a digital signal by using an A/D converter (not shown) and outputs it therefrom.

The operation console section 3 will be explained.

As shown in FIG. 1, the operation console section 3 has the controller 30, a data processor 31, an operation unit 32, a display or display unit 33 and a storage unit 34.

Respective constituent elements of the operation console section 3 will be described sequentially.

The controller 30 has a computer and a memory that stores programs that allow the computer to execute predetermined data processing, and controls respective parts. Here, the controller 30 inputs operation data sent from the operation unit 32 and outputs the control signal to the RF driver 22, gradient driver 23 and data acquisition unit 24 respectively, based on the operation data inputted from the operation unit 32, thereby executing a predetermined scan. Along with it, the controller 30 outputs control signals to the data processor 31, display unit 33 and storage unit 34 to perform control on the respective parts.

The data processor 31 has a computer and programs that execute predetermined data processing using the computer. The data processor 31 executes data processing, based on the control signal supplied from the controller 30.

Figure 2:
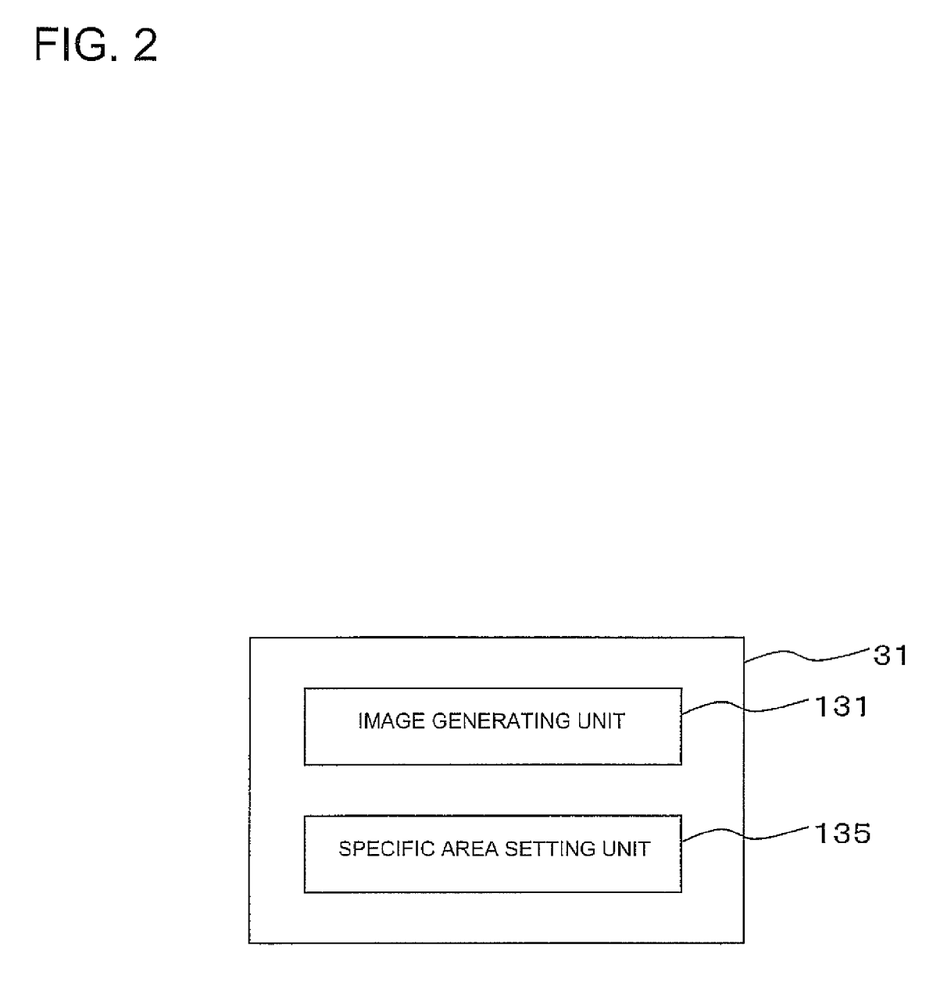
FIG. 2 is a block diagram illustrating a data processor 31 employed in the embodiment according to the invention.

FIG. 2 is a block diagram showing the data processor 31 employed in the embodiment according to the invention.

As shown in FIG. 2, the data processor 31 has an image generation unit 131 and a specific area setting unit 135.

Here, the image generation unit 131 generates an image about the imaging area of the subject SU with each magnetic resonance signal acquired by execution of the scan by the scan section 2 as raw data. In the present embodiment, a form image indicative of a form about the imaging area is produced based on the acquired magnetic resonance signals. Although the details thereof are explained later, the image generation unit 131 generates a quantitative value image, based on the acquired magnetic resonance signals in addition to the above in such a manner that it indicates quantitative values of the characteristics of the imaging area measured with respect to the position corresponding to a specific area set at the imaging area, when the specific area is set at the form image by the specific area setting unit 135. For example, a quantitative value image is produced such that the quantitative values are expressed in figures. Described specifically, the average of the quantitative values measured at the position corresponding to the set specific area is calculated and the quantitative value image is produced in such a manner that the calculated average value is expressed in figures. Described specifically, the display unit 33 displays the quantitative value image in such a manner that it indicates the average of the quantitative values measured at the position corresponding to the set specific area.

The specific area setting unit 135 sets a specific area at the form image displayed on the display screen by the display unit 33. In the present embodiment, the specific area setting unit 135 sets the specific area at the form image so as to correspond to the position of the specific area inputted to the operation unit 32. That is, the position of the specific area is set based on instructions inputted to the operation unit 32 by an operator.

The operation unit 32 is constituted of an input device such as a keyboard, a pointing device or the like. The operation unit 32 inputs operation data from the operator and outputs the same to the controller 30. In the present embodiment, as will be descried later, the position of the specific area set at the form image displayed by the display unit 33 is inputted by the operator.

The display unit 33 is constituted of a display device such as a CRT and displays each image on its display screen, based on the control signal outputted from the controller 30. For example, the display unit 33 displays images about input items corresponding to the operation data inputted to the operation unit 32 by the operator on the display screen in plural form. Further, the display unit 33 receives data about each image of the subject SU generated based on the magnetic resonance signal produced from the subject SU from the data processor 31 and displays the image on the display screen. In the present embodiment, although the details thereof are described later, the display unit 33 displays the form image generated by the image generation unit 131 on its display screen. In addition to it, the display unit 33 displays the quantitative value image generated by the image generation unit 131 side by side with the form image upon setting the specific area at the form image by the specific area setting unit 135. For example, the display unit 33 displays the quantitative value image such that its quantitative values are expressed in figures.

The storage unit 34 comprises a memory and stores various data therein. In the storage unit 34, the stored data are accessed by the controller 30 as needed.

Operation. The operation of imaging the imaging area of the subject SU will be explained below using the magnetic resonance imaging apparatus 1 illustrative of the embodiment according to the invention.

Figure 3:
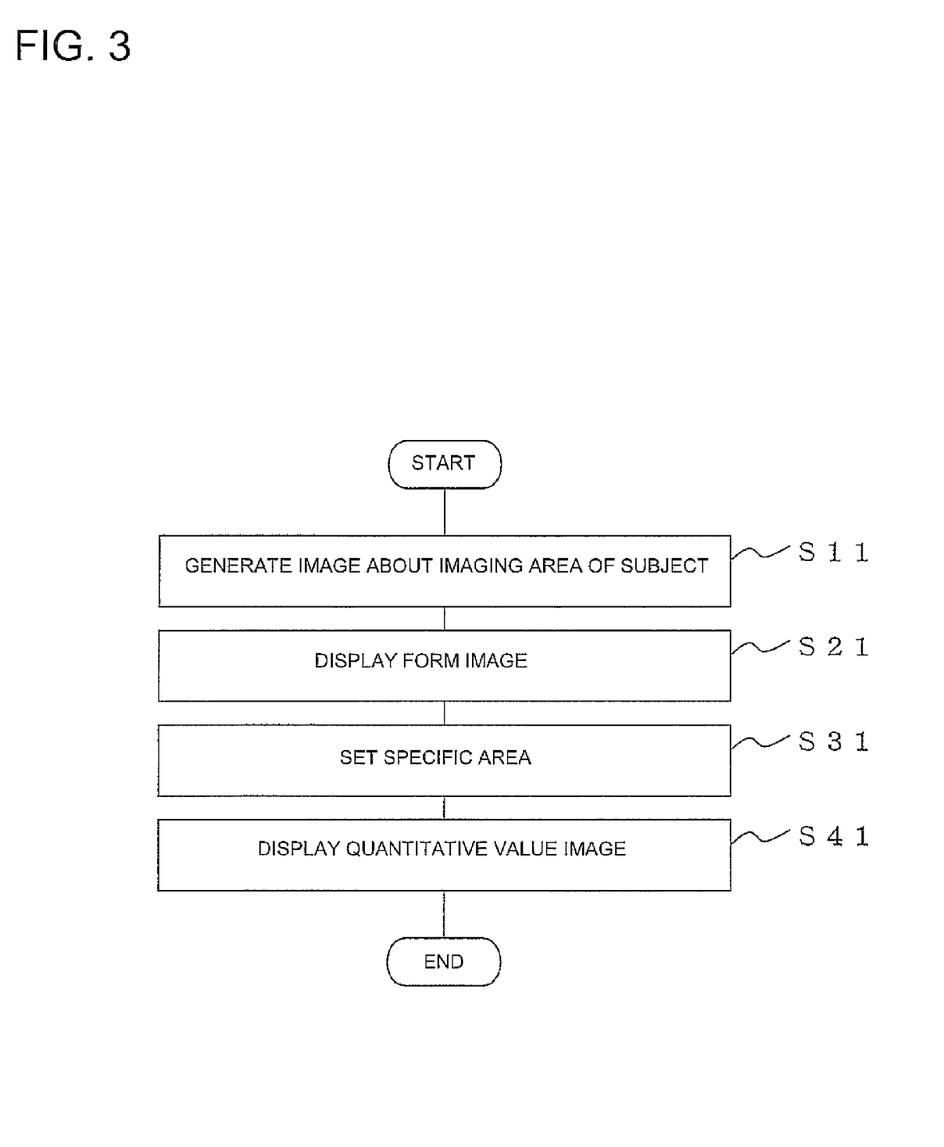
FIG. 3 is a flowchart showing operation taken when an imaging area of a subject SU is imaged in the embodiment according to the invention.

FIG. 3 is a flowchart showing operation of the embodiment according to the invention, at the time that the imaging area of the subject SU is imaged.

As shown in FIG. 3, each image is produced with respect to the imaging area of the subject (S11).

Here, the image generation unit 131 produces images about the imaging area on the basis of the magnetic resonance signals acquired by executing a scan by the san section after the scan section has scanned the imaging area of the subject.

In the present embodiment, the form image indicative of the form about the imaging area of the subject is generated. For example, a scan is executed with the head of the subject as an imaging area. The image generation unit 131 produces a T2-weighted image about an axial plane of its head as a form image. In addition to it, a diffusion-weighted image or the like may be produced as the form image.

Further, the quantitative values are measured with respect to the characteristics of the imaging area of the subject, and a quantitative image obtained by mapping the quantitative values is produced. In a manner similar to the case in which the above form image is produced, a scan is executed with the head of the subject as the imaging area. Based on the magnetic resonance signals acquired by the scan, ADC (Apparent Diffusion Coefficient) values each corresponding to an apparent diffusion coefficient of tissue are calculated with respect to the axial plane of the subject's head at which the form image is formed above, for example. Thereafter, the calculated ADC values are mapped to produce an ADC map image as a quantitative image by the image generation unit 131. In addition to it, the velocity of fluid such as blood flowing through the blood vessels at the axial plane is calculated based on each magnetic resonance signal to produce a velocity image indicative of its velocity as a quantitative image. Further, a T2 value is calculated based on the magnetic resonance signal to produce a T2 image indicative of the T2 value as a quantitative image. Incidentally, a T2*value may be calculated according to a pulse sequence to produce a T2*image indicative of the T2*value.

Next, as shown in FIG. 3, a form image is displayed (S21).

Here, the display unit 33 displays the form image generated by the image generation unit 131 in the above-described manner on its display screen.

Figure 4:
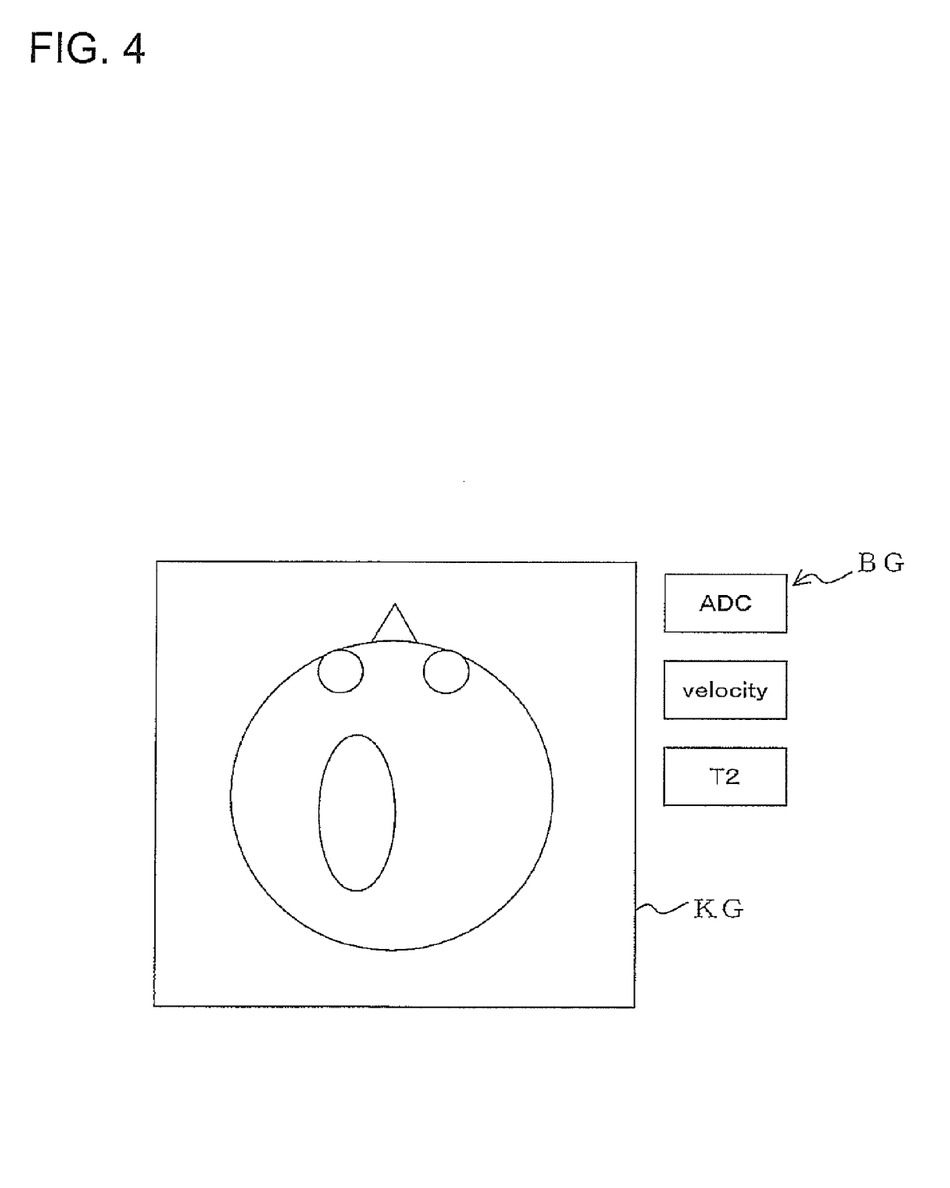
FIG. 4 is a diagram illustrating a displayed form image KG obtained in the embodiment according to the invention.

FIG. 4 is a diagram showing a form image KG displayed in the embodiment according to the invention.

As shown in FIG. 4, for example, the display unit 33 displays the T2-weighted image generated by the image generation unit 131 as the form image KG with respect to the axial plane of the subject's head.

At this time, as shown in FIG. 4, the display unit 33 displays a plurality of images indicative of a plurality of characteristic parameters having produced the quantitative images as above so as to be arranged side by side with the form image KG. Described specifically, the display unit 33 displays a plurality of button images BG respectively indicative of characteristic parameters of ADC, velocity and T2.

Next, as shown in FIG. 3, a specific area is set (S31).

Here, the specific area setting unit 135 sets the specific area at the form image displayed on the display screen by the display unit 33.

In the present embodiment, the position of the specific area set at the form image displayed by the display unit 33 is inputted to the operation unit 32 by the operator. Then, the specific area setting unit 135 sets a specific area at the form image so as to correspond to the position of the specific area inputted to the operation unit 32 by the operator.

Figure 5:
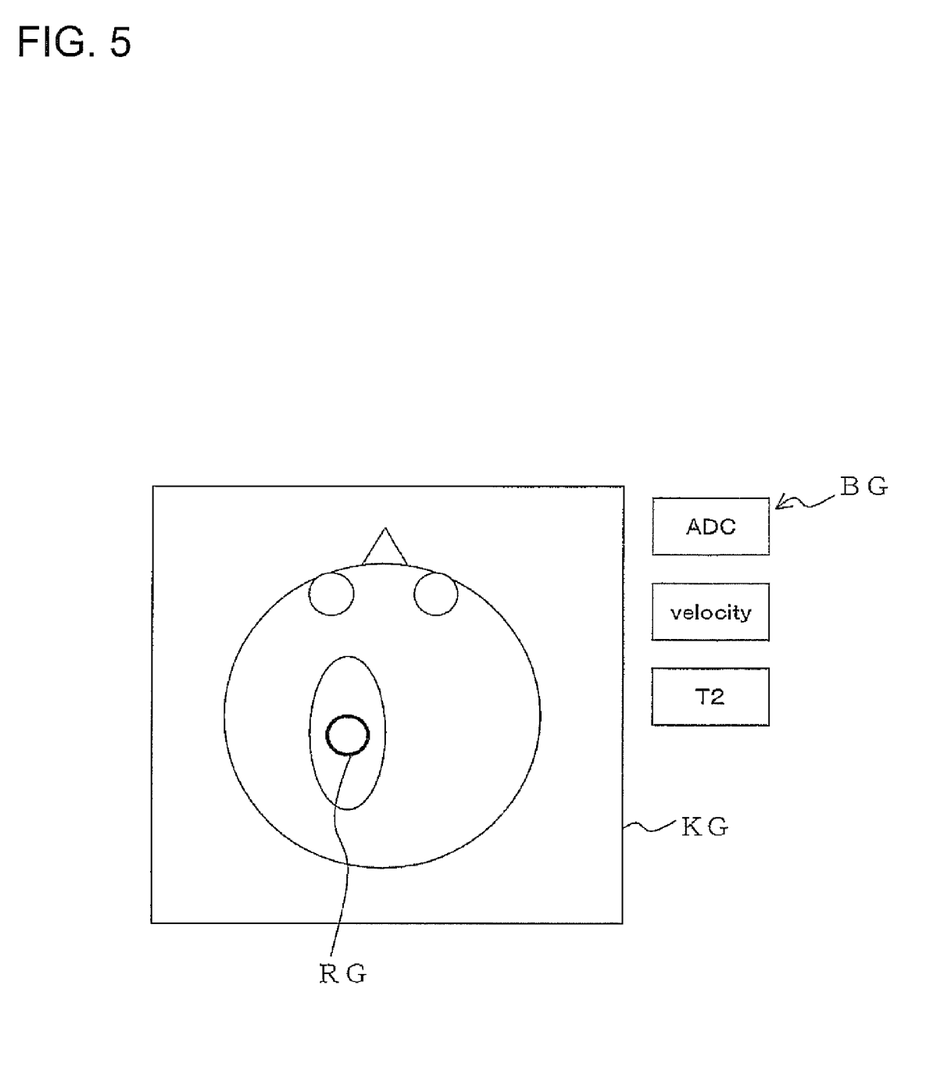
FIG. 5 is a diagram depicting the manner in which the position of a specific area in a form image is set in the embodiment according to the invention.

FIG. 5 is a diagram showing the manner in which the position of a specific area at a form image is set in the embodiment according to the invention.

As shown in FIG. 5, the operator selects the coordinates of a spot or portion targeted for diagnosis at the form image KG as a region of interest ROI using the pointing device of the operation unit 32. Then, the specific area setting unit 135 sets the region of interest ROI as a specific area, based on information on the coordinates selected as the region of interest ROI. The display unit 33 displays a region-of-interest image RG so as to overlap with the form image KG on the display screen in association with the position of the specific area set as the region of interest ROI.

Here, the operator selects the corresponding characteristic parameter for displaying the quantitative value about the specific area from the plurality of characteristic parameters having produced the quantitative images. A command for the selection of the characteristic parameter is inputted to the operation unit 32 by the operator.

Described specifically, when the operator selects ADC from the button images indicative of the respective characteristic parameters of ADC, velocity and T2, the operator selects the button image corresponding to the selected characteristic parameter, using the pointing device of the operation unit 32. Thus, the characteristic parameter for displaying the quantitative value about the specific area is set by the data processor 31.

Next, as shown in FIG. 3, a quantitative value image is displayed (S41).

Here, when the specific area is set at the form image by the specific area setting unit 135, the image generation unit 131 first produces a quantitative value image, based on the acquired magnetic resonance signals such that it indicates quantitative values of the characteristics of an imaging area measured with respect to the position corresponding to the specific area set at the imaging area.

Figure 6:
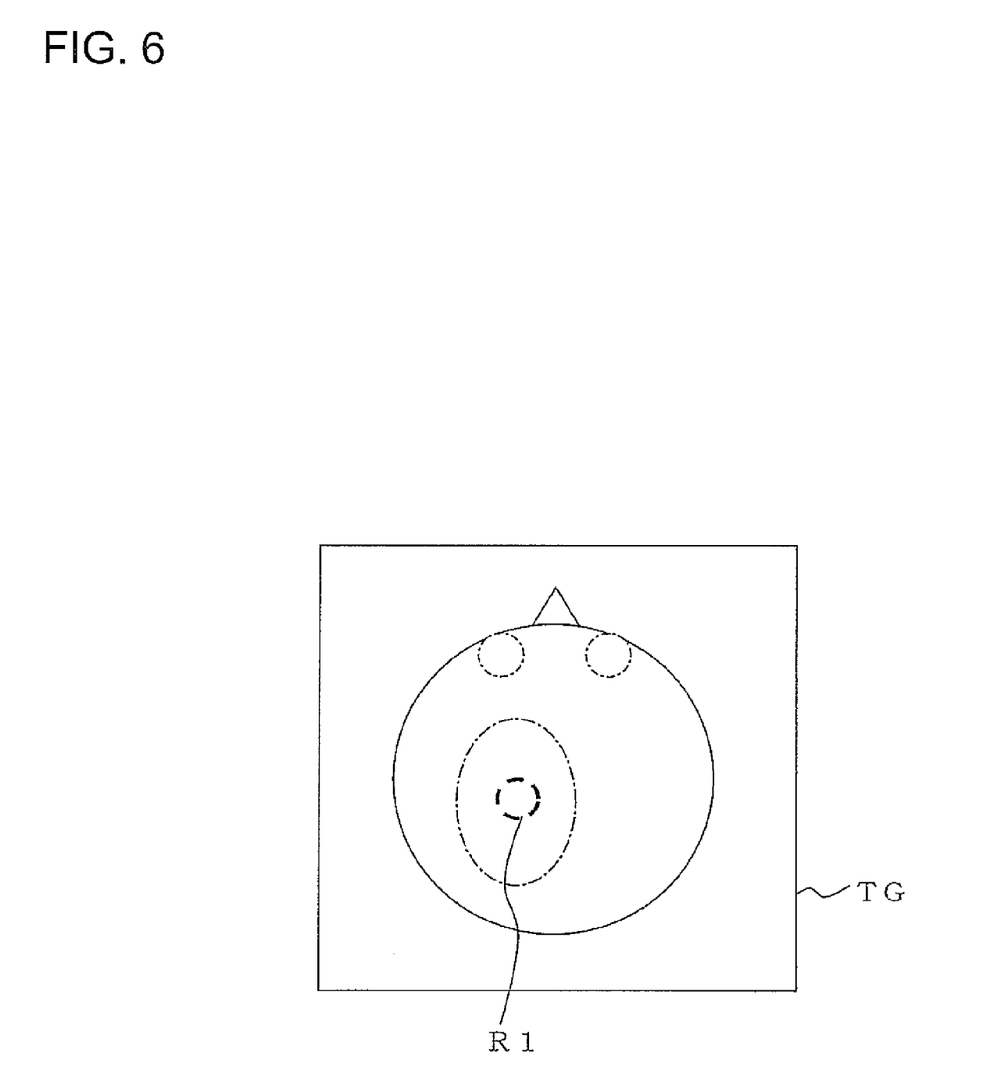
FIG. 6 is a diagram showing the manner in which an image generator 31 produces a quantitative value image in the embodiment according to the invention.

FIG. 6 is a diagram showing the manner in which the image generation unit 131 produces a quantitative value image in the embodiment according to the invention.

When a quantitative value image TVG is produced as shown in FIG. 6, the position corresponding to the position of a specific area set as a region of interest ROI at a form image KG is specified at a quantitative image TG like the previously-produced ADC map or the like. Such a region R1 as indicated by a dotted line in FIG. 6, for example is specified. Incidentally, there is a case in which setting the region of interest ROI as a target for diagnosis becomes difficult because the contour of tissue is not clear. Therefore, the specific area is set as the region of interest ROI at the form image KG as described in the present embodiment.

Here, when the form image KG and the quantitative image TG are different from each other in FOV and image center upon specifying, at the quantitative image TG, the position corresponding to the position of the specific area set as the region of interest ROI at the form image KG, at least one of the form image KG and the quantitative image TG is scaled up or down, thereby aligning the magnitudes of FOVs with each other and shifting the image centers so as to coincide with each other. Thereafter, a position corresponding to the position of the specific area set as the region of interest ROI at the form image KG is specified.

Described specifically, the quantitative image TG is scaled up or down in such a manner that, for example, FOV of the quantitative image TG be identical to FOV of the form image KG, on the basis of information about FOV at the generation of the form image KG and information about FOV at the generation of the quantitative image TG. That is, the sizes of outer frames for sectioning or laying out both images are adjusted in such a manner that they correspond to each other. On the basis of information about an image center at the generation of the form image KG and information about an image center at the generation of the quantitative image TG, the respective positions of pixels of the quantitative image TG are moved in such a manner that the image center of the quantitative image TG assumes the same position as the image center of the form image KG at FOV.

After the position corresponding to the position of the specific area set as the region of interest ROI at the form image KG has been specified in this way, the quantitative values measured at the respective pixel positions are extracted at the set specific area. Then, the average of the extracted plural quantitative values is calculated and thereafter a quantitative value image TVG is generated such that the calculated average value is expressed in figures.

Figure 7:
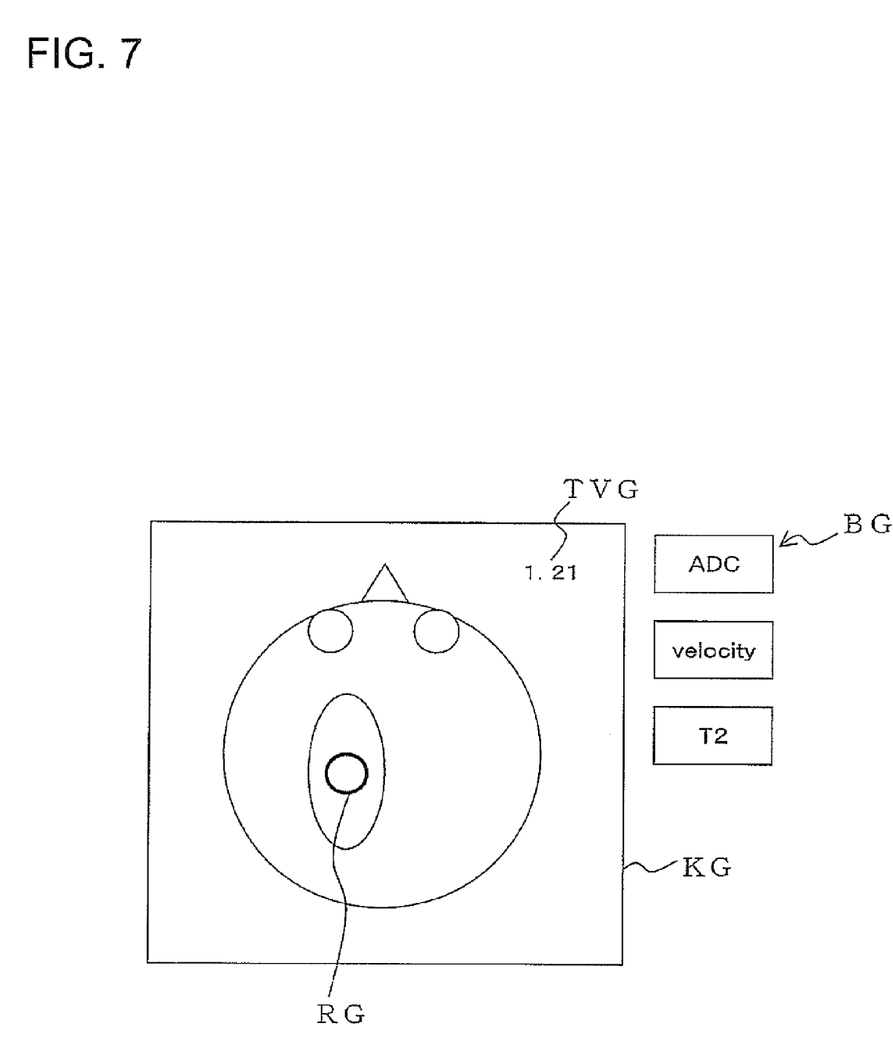
FIG. 7 is a diagram showing the manner in which a display unit 33 displays a quantitative value image TVG produced by the image generation unit 131 in the present embodiment according to the invention.

FIG. 7 is a diagram showing the manner in which the display unit 33 displays the quantitative value image TVG produced by the image generation unit 131 in the embodiment according to the invention.

After the image generation unit 131 has produced the quantitative value image TVG as shown in FIG. 7, the display unit 33 displays the generated quantitative value image TVG side by side with the form image KG on its display screen. As shown in FIG. 7, for example, the display unit 33 displays the quantitative value image TVG generated so as to express the quantitative value in figures, at the upper portion of its screen.

In the present embodiment as described above, the magnetic resonance signals are acquired from the imaging area of the subject in the imaging space B formed with the static magnetic field. On the basis of the acquired magnetic resonance signals, the form image KG indicative of the form about the imaging area and the quantitative value image TVG indicative of the quantitative values measured with respect to the characteristics of the imaging area are produced and displayed. Here, the image generation unit 131 generates the form image KG, based on each magnetic resonance signal, and the display unit 33 displays the form image KG produced by the image generation unit 131 on its display screen. When the specific area setting unit 135 sets the specific area at the form image KG displayed on the display screen by the display unit 33, the image generation unit 131 generates the quantitative value image TVG indicative of the characteristic's quantitative values measured with respect to the position corresponding to the set characteristic area, based on the magnetic resonance signals. Thereafter, the display unit 33 displays the quantitative value image TVG generated by the image generation unit 131 side by side with the form image KG on the display screen. Therefore, the present embodiment is capable of making it unnecessary cumbersome operations and improving diagnostic efficiency because the quantitative values for the characteristics of the specific area of tissue targeted for diagnosis at the form image KG can be displayed with a simple operation.

Since the positions of the specific areas of tissues targeted for diagnosis between the two are automatically matched or checked against each other even when the centers of FOVs of the form image and the quantitative image are placed in their corresponding positions different from each other, cumbersome operations are made unnecessary and diagnostic efficiency can hence be improved.

Thus, the present embodiment is capable of enhancing diagnostic efficiency because it is easy to accurately specify the position of the tissue targeted for diagnosis upon diagnosing the target for diagnosis quantitatively.

Incidentally, in the above embodiment, the magnetic resonance imaging apparatus 1 is equivalent to the magnetic resonance imaging apparatus of the invention. In the above embodiment, the display unit 33 is equivalent to the display unit of the invention. In the above embodiment, the image generation unit 131 is equivalent to the image generation unit of the invention. In the above embodiment, the specific area setting unit 135 is equivalent to the specific area setting unit of the invention.

Upon implementation of the invention, the invention is not limited to the above-described embodiment, and various modifications can be adopted.

The invention can suitably be applied even to a case in which, for example, a scan is effected on a three-dimensional area. In this case, at least one of a form image and a quantitative image may be subjected to a three-dimensional interpolation process. The invention can similarly be applied even to quantitative values of the velocity of flow of blood and the like measured by, for example, a phased contrast method.

Many widely different embodiments of the invention may be configured without departing from the spirit and the scope of the present invention. It should be understood that the present invention is not limited to the specific embodiments described in the specification, except as defined in the appended claims.

The invention claimed is:

1. An image display apparatus configured to display a form image indicative of a form about an imaging area of a subject and a quantitative value image indicative of quantitative values measured with respect to characteristics of the imaging area, said image display apparatus comprising:
   a display unit configured to display the form image on a display screen thereof; and
   a specific area setting unit configured to set a specific area at the displayed form image,
   wherein the display unit is configured to display the quantitative value image aligned with the form image on the display screen such that the quantitative value image indicates the quantitative values measured at a position corresponding to the specific area set at the imaging area.

2. The image display apparatus according to claim 1, wherein the display unit is configured to display the quantitative value image such that the quantitative values are expressed in figures.

3. The image display apparatus according to claim 1, wherein the display unit is configured to display the quantitative value image such a that the quantitative value image indicates an average of the quantitative values measured at the position corresponding to the specific area.

4. The image display apparatus according to claim 1, further comprising an operation unit configured to receive the position of the specific area set at the form image from an operator,
wherein the specific area setting unit is configured to set the specific area at the form image to correspond to the position of the specific area.

5. The image display apparatus according to claim 1, wherein the form image is a slice image image-reconstructed based on each magnetic resonance signal obtained from the imaging area of the subject.

6. The image display apparatus according to claim 1, wherein the quantitative values are measured based on magnetic resonance signals obtained from the subject.

7. An image display method for displaying a form image indicative of a form about an imaging area of a subject and a quantitative value image indicative of quantitative values measured with respect to characteristics of the imaging area, said image display method comprising:
displaying the form image on a display screen;
setting a specific area at the form image displayed on the display screen; and
displaying the quantitative value image aligned with the form image on the display screen to indicate the quantitative values measured at a position corresponding to the specific area set at the imaging area.

8. The image display method according to claim 7, wherein displaying the quantitative value image further comprises displaying the quantitative value image such that the quantitative values are expressed in figures.

9. The image display method according to claim 7, wherein displaying the quantitative value image further comprises displaying the quantitative value image to indicate an average of the quantitative values measured at the position corresponding to the specific area.

10. The image display method according to claim 7, further comprising inputting the position of the specific area at the form image,
wherein setting a specific area further comprises setting the specific area at the form image to correspond to the inputted position of the specific area.

11. The image display method according to claim 7, wherein displaying the form image further comprises displaying a slice image image-reconstructed based on each magnetic resonance signal obtained from the imaging area of the subject.

12. The image display method according to claim 7, further comprising measuring the quantitative values based on magnetic resonance signals obtained from the subject.

13. A magnetic resonance imaging apparatus configured to acquire magnetic resonance signals from an imaging area of a subject in an imaging space formed with a static magnetic field, to generate a form image indicative of a form about the imaging area and a quantitative value image indicative of quantitative values measured with respect to characteristics of the imaging area based on the acquired magnetic resonance signals and, to display the form image and the quantitative value image, said magnetic resonance imaging apparatus comprising:
an image generation unit configured to generate the form image based on the magnetic resonance signals;
a display unit configured to display the generated form image on a display screen thereof; and
a specific area setting unit configured to set a specific area at the displayed form image,
wherein the image generation unit is configured to generate the quantitative value image based on the magnetic resonance signals such that the quantitative value image indicates the quantitative values of the characteristics of the imaging area measured at a position corresponding to the specific area set at the imaging area when the specific area is set, and
wherein the display unit is configured to display the quantitative value image aligned with the form image on the display screen.

14. The magnetic resonance imaging apparatus according to claim 13, wherein the image generation unit is configured to generate the quantitative value image such that the quantitative values are expressed in figures.

15. The magnetic resonance imaging apparatus according to claim 14, further comprising an operation unit configured to receive the position of the specific area set at the form image from an operator,
wherein the specific area setting unit is configured to set the specific area at the form image to correspond to the position of the specific area inputted to the operation unit.

16. The magnetic resonance imaging apparatus according to claim 13, wherein the image generation unit is configured to generate the quantitative value image such that the quantitative value image indicates an average of the quantitative values measured at the position corresponding to the specific area.

17. The magnetic resonance imaging apparatus according to claim 16, further comprising an operation unit configured to receive the position of the specific area set at the form image from an operator,
wherein the specific area setting unit is configured to set the specific area at the form image to correspond to the position of the specific area inputted to the operation unit.

18. The magnetic resonance imaging apparatus according to claim 13, further comprising an operation unit configured to receive the position of the specific area set at the form image from an operator,
wherein the specific area setting unit is configured to set the specific area at the form image to correspond to the position of the specific area inputted to the operation unit.

19. The image display apparatus according to claim 1, further comprising an image generation unit configured to scale at least one of the form image and the quantitative value image to align magnitudes of a field of view of the form image and a field of view of the quantitative value image.

20. The image display apparatus according to claim 1, further comprising an image generation unit configured to scale at least one of the form image and the quantitative value image to shift centers of the form image and the quantitative value image to coincide with each other.

* * * * *